United States Patent
Changchien et al.

(10) Patent No.: US 9,799,530 B2
(45) Date of Patent: Oct. 24, 2017

(54) METHOD OF SELECTIVELY REMOVING SILICON NITRIDE AND ETCHING APPARATUS THEREOF

(71) Applicant: TAIWAN SEMICONDUCTOR MANUFACTURING CO., LTD., Hsinchu (TW)

(72) Inventors: Ying-Hsueh Changchien, Hsinchu (TW); Yu-Ming Lee, New Taipei (TW); Chi-Ming Yang, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 14/056,673

(22) Filed: Oct. 17, 2013

(65) Prior Publication Data
US 2015/0111311 A1    Apr. 23, 2015

(51) Int. Cl.
*H01L 21/306* (2006.01)
*H01L 21/67* (2006.01)
*H01L 21/311* (2006.01)
*H01L 21/66* (2006.01)

(52) U.S. Cl.
CPC .............................. *H01L 21/31111* (2013.01)

(58) Field of Classification Search
None
See application file for complete search history.

(56) References Cited

U.S. PATENT DOCUMENTS

| | | | |
|---|---|---|---|
| 6,303,514 B1* | 10/2001 | Hackett et al. | 438/745 |
| 8,105,851 B1* | 1/2012 | Ku et al. | 438/8 |
| 2001/0001728 A1* | 5/2001 | Jan | H01L 21/31111 438/689 |
| 2008/0179293 A1* | 7/2008 | Wei | H01L 21/31111 216/84 |
| 2009/0087929 A1* | 4/2009 | Yu et al. | 438/8 |
| 2009/0280235 A1* | 11/2009 | Lauerhaas | H01L 21/67017 427/58 |
| 2010/0022721 A1* | 1/2010 | Mertens | 526/75 |
| 2013/0203262 A1* | 8/2013 | Butterbaugh | H01L 21/31111 438/748 |

* cited by examiner

*Primary Examiner* — Seahvosh Nikmanesh
*Assistant Examiner* — Xiaoming Liu
(74) *Attorney, Agent, or Firm* — McDermott Will & Emery LLP

(57) ABSTRACT

A method of selectively removing silicon nitride is provided. The method includes: providing a wafer having silicon nitride on a surface of the wafer; supplying a mixture of phosphoric acid and a silicon-containing material into a process tank, in which the mixture has a predetermined silicon concentration; and submerging the wafer into the mixture within the process tank to remove the silicon nitride. An etching apparatus of selectively removing silicon nitride is also provided.

19 Claims, 2 Drawing Sheets

METHOD OF SELECTIVELY REMOVING SILICON NITRIDE AND ETCHING APPARATUS THEREOF

BACKGROUND

Integrated circuit fabrication processes include steps in which some materials should be selectively removed through either wet or dry etching process. Regardless of the method used, the selectivity between the materials that are removed and those that are not removed should be high.

Silicon nitride is a dielectric material that is very commonly applied in the manufacture of semiconductor devices. The wet etching process is commonly used for removing silicon nitride in the presence of oxides. In general, silicon nitride on a semiconductor substrate is selectively etched by soaking the substrate in a hot phosphoric acid bath for a period of time. Etching silicon nitride by phosphoric acid may be described by the following equation:

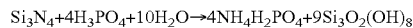

In this equation, the silicon atom is oxidized and thus forms hydrous silica ($Si_3O_2(OH)_8$) in solution, which inhibits the etching of silicon oxide so as to increase selectivity of silicon nitride to silicon oxide. In order to increase silicon concentration of the hot phosphoric acid bath to obtain enough high selectivity, a number of dummy wafers, each having a silicon nitride layer, may be soaked in the bath for a period of time before processing the semiconductor substrate, which results in additional preparation time and manufacturing cost. Given the above, it remains desirable to provide an etching process without soaking the dummy wafers in the bath before processing the semiconductor substrate.

BRIEF DESCRIPTION OF THE DRAWINGS

Embodiments of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
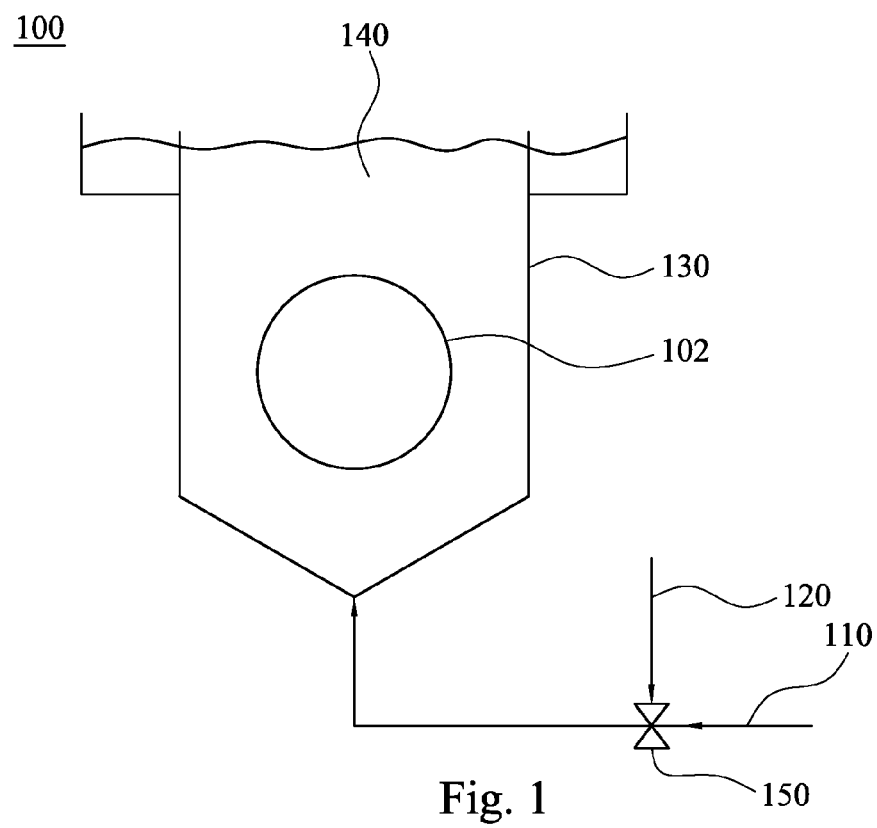
FIG. 1 is a schematic diagram of an etching apparatus according to various embodiments of the present disclosure.

It is to be understood that the following disclosure provides many different embodiments, or examples, for implementing different features of the disclosure. Specific examples of components and arrangements are described below to simplify the present disclosure. These are, of course, merely examples and are not intended to be limiting. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for the sake of simplicity and clarity.

The singular forms "a," "an" and "the" used herein include plural referents unless the context clearly dictates otherwise. Therefore, reference to, for example, a silicon nitride layer includes embodiments having two or more such silicon nitride layers, unless the context clearly indicates otherwise. Reference throughout this specification to "one embodiment" or "an embodiment" means that a particular feature, structure, or characteristic described in connection with the embodiment is included in at least one embodiment of the present disclosure. Therefore, the appearances of the phrases "in one embodiment" or "in an embodiment" in various places throughout this specification are not necessarily all referring to the same embodiment. Further, the particular features, structures, or characteristics may be combined in any suitable manner in one or more embodiments. It should be appreciated that the following figures are not drawn to scale; rather, these figures are intended for illustration.

Selectively etching a silicon nitride layer on the semiconductor substrate may be performed by soaking the substrate in a hot phosphoric acid bath for a period of time. The chemical reaction that silicon nitride is etched by phosphoric acid may be described by the following equation:

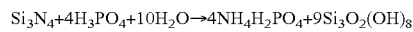

In the equation, the silicon atom is oxidized and thus forms hydrous silica ($Si_3O_2(OH)_8$) in solution, which inhibits the etching of silicon oxide so as to increase selectivity of silicon nitride to silicon oxide. However, it takes lengthy time and high cost for soaking dummy wafers in the hot phosphoric acid bath to increase silicon concentration and thereby achieving sufficiently high selectivity. Accordingly, the present disclosure provides a novel etching process including supplying a mixture of phosphoric acid and a silicon-containing material into a process tank, in which the mixture possesses high selectivity of silicon nitride to silicon oxide (hereinafter referred to "selectivity"), and then submerging a wafer into the mixture within the process tank to remove silicon nitride. The term "wafer" herein refers to the object being actually processed in accordance with the present disclosure in view of the dummy wafer. Because of the mixture having the higher selectivity, there is no need for soaking the dummy wafers in, which is conventionally applied, the bath before processing the wafer, so as to avoid the issues therefrom. The selectivity of the mixture is as great as possible. In various embodiments, the selectivity is greater than or equal to 100:1.

In order to perform the novel etching process, an etching apparatus is provided. FIG. 1 is a schematic diagram of an etching apparatus 100 according to various embodiments of the present disclosure. The etching apparatus 100 is used to perform the etching process on a wafer 102 having silicon nitride on a surface thereof. In one embodiment, the wafer 102 has a silicon nitride layer (not shown) located on the surface thereof. The etching apparatus 100 includes first and second component suppliers 110, 120 for respectively supplying phosphoric acid and the silicon-containing material, and a process tank 130 coupled thereto.

The first component supplier 110 is coupled to the process tank 130. Phosphoric acid may be provided from a liquid supply reservoir (not shown) to the process tank 130 through the first component supplier 110. The first component supplier 110 may be a piping line. The etching apparatus 100 may further include a heater (not shown) that preheats phosphoric acid to a predetermined temperature. In various embodiments, the predetermined temperature is in a range of about 100° C. to about 180° C. In various embodiments, the predetermined temperature is in a range of about 120° C. to about 170° C. The heater may be disposed covering a portion of the first component supplier 110 but not limited thereto.

The second component supplier 120 is coupled to the first component supplier 110, such that phosphoric acid and the silicon-containing material mix to form a mixture having a predetermined silicon concentration before entering the process tank 130. In various embodiments, the silicon-containing material is organosilane, organosiloxane, colloidal silica, electrolyzed silicon or a combination thereof, or a silicon oxide powder. In one embodiment, the silicon-containing material is flowable and provided from another liquid supply reservoir (not shown) through the second component supplier 120. The second component supplier 120 may also be a piping line.

The process tank 130 is coupled to the first and second component suppliers 110, 120 for containing the mixture 140. The process tank 130 is adapted to receive and process a plurality of wafers 102. In addition, a holder (not shown) may be loaded with the wafers 102 and placed in the process tank 130.

The etching apparatus 100 may further include a heater (not shown) that heats the mixture 140 to a predetermined temperature. In various embodiments, the predetermined temperature is in a range of about 100° C. to about 180° C. In various embodiments, the predetermined temperature is in a range of about 120° C. to about 170° C. The heater may be disposed covering an outer wall of the process tank 130 but not limited thereto.

In the current embodiment, the etching apparatus 100 further includes a switch valve 150 located between the first and second component suppliers 110, 120 for allowing phosphoric acid or the silicon-containing material to enter the process tank 130. In other words, the switch valve 150 may be utilized to supply phosphoric acid or the silicon-containing material to adjust the silicon concentration of the mixture 140.

Figure 2:
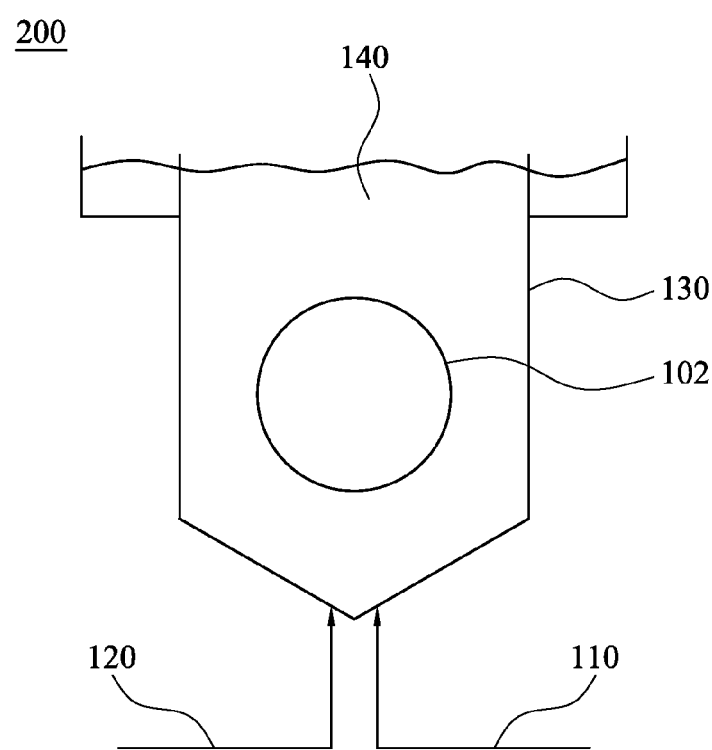
FIG. 2 is a schematic diagram of an etching apparatus according to various embodiments of the present disclosure.

FIG. 2 is a schematic diagram of an etching apparatus 200 according to various embodiments of the present disclosure. The difference between the etching apparatus 100 and the etching apparatus 200 is that the second component supplier 120 of the etching apparatus 200 is not coupled to the first component supplier 110. Phosphoric acid and the silicon-containing material are respectively supplied into the process tank 130 and then mixed for a period of time to form the mixture 140. In various embodiments, as shown in FIG. 1, phosphoric acid and the silicon-containing material are in advance mixed in the first component supplier 110 before entering the process tank 130, and thus preparation time of the uniformly mixture are reduced in comparison with that of FIG. 2. Feed rates of both the silicon-containing material and phosphoric acid can be appropriately adjusted to obtain the uniformly mixture before entering the process tank 130.

Figure 3:
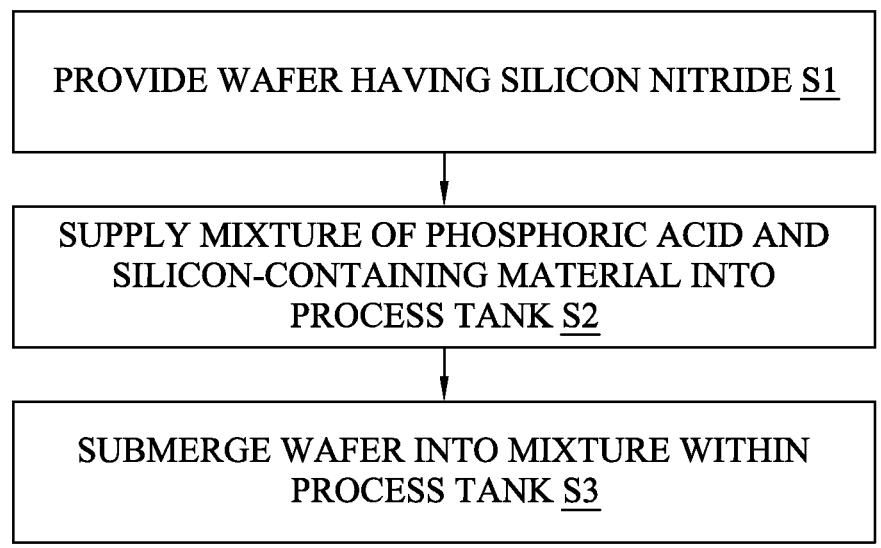
FIG. 3 is a flow chart illustrating a method of selectively etching silicon nitride according to various embodiments of the present disclosure.

FIG. 3 is a flow chart illustrating a method 300 of selectively etching silicon nitride according to various embodiments of the present disclosure. The method 300 may be performed by using an etching apparatus, such as the etching apparatuses 100, 200 of FIGS. 1-2.

In operation S1, a wafer having silicon nitride on a surface thereof is provided. In one embodiment, the wafer has a silicon nitride layer located on the surface thereof. The wafer may further include other materials or structures of a semiconductor or electronics device. In one embodiment, the wafer further has silicon oxide.

In operation S2, a mixture of phosphoric acid and a silicon-containing material is supplied into a process tank. In one embodiment, the mixture is heated to a predetermined temperature to have enough high etch rate of silicon nitride. In various embodiments, the predetermined temperature is in a range of about 100° C. to about 180° C. In various embodiments, the predetermined temperature is in a range of about 120° C. to about 170° C.

Phosphoric acid and the silicon-containing material may be mixed in any place, such as the process tank or other elements. In various embodiments, operation S2 includes: providing phosphoric acid; adding the silicon-containing material into phosphoric acid to form the mixture; and transmitting the mixture into the process tank. For an example, as shown in FIG. 1, phosphoric acid and the silicon-containing material are mixed in the first component supplier 110 before entering the process tank 130. Phosphoric acid may be preheated to a predetermined temperature before adding the silicon-containing material into phosphoric acid to help dissolve the silicon-containing material. In various embodiments, the predetermined temperature is in a range of about 100° C. to about 180° C. In various embodiments, the predetermined temperature is in a range of about 120° C. to about 170° C. In other embodiments, operation S2 is conducted by respectively supplying phosphoric acid and the silicon-containing material into the process tank. For an example, as shown in FIG. 2, phosphoric acid and the silicon-containing material are respectively supplied into the process tank 130. Phosphoric acid may also be preheated to the predetermined temperature mentioned above before entering the process tank 130.

In various embodiments, the silicon-containing material is organosilane, organosiloxane, colloidal silica, electrolyzed silicon or a combination thereof. The organosilane or organosiloxane is a compound in which the basic atom or basic skeleton includes Si or Si—O and each of the side groups includes an organic group (e.g., an alkyl group such as methane or ethane, an alkoxyl group such as a methoxy group, an ethoxy group, an acetoxyl group, an aryl group, or the like). Examples of the organosilane and organosiloxane include tetraethoxysilane (TEOS), tetramethoxysilane (TMOS), tetramethylsilane, tetramethylcyclotetrasiloxane, octomethylcyclotetrasiloxane, and diacetoxy-di-tertbutoxysilane, but not limited thereto. In one embodiment, the silicon-containing material is TEOS, which is easily dissolved in phosphoric acid to significantly inhibit the etching of silicon oxide. The organic group may be substituted, for example, by a halogen, a hydrogen atom, a hydroxyl group and an NH (ammonia) group.

The colloidal silica may be prepared by any conventional method, such as ion exchange or addition of an aqueous solution of an alkali metal hydroxide to solid silica. The colloidal silica can be dispersed in a solvent (e.g., water) to form colloidal silica solution that is more easily dissolved in phosphoric acid.

The electrolyzed silicon may be fabricated by electrolyzing silicon-containing compound (e.g., silicon-containing salt). The electrolyzed silicon can be uniformly mixed with phosphoric acid.

In other embodiments, the silicon-containing material is a silicon oxide powder, such as the silicon oxide powder of chemical mechanical polishing (CMP) slurry. The silicon oxide powder will be etched by phosphoric acid and thus to form the homogeneous mixture.

According to various embodiments, the mixture has a predetermined silicon concentration to exhibit the required selectivity. As such, the wafer can be directly processed with no need of previously soaking the dummy wafers in the phosphoric acid bath. In various embodiments, the silicon-containing material has a silicon concentration less than about 200 ppm based on the weight of the mixture. In various embodiments, the mixture has a silicon concentration less than about 120 ppm based on the weight of the mixture. In various embodiments, the mixture has a silicon concentration greater than or equal to about 40 ppm based on the weight of the mixture. It is noteworthy that the predetermined silicon concentration should not exceed the silicon saturation concentration to avoid forming silica precipitates. The silicon saturation concentration is varied with the temperature of the process.

For specific examples, the mixtures having the silicon concentration of 0 (comparative example), 40, 60, 80 and 100 ppm by adding various amounts of TEOS into phosphoric acid respectively have selectivity of 40:1, 150:1, 225:1, 175:1 and 250:1 at 150 to 155° C. Therefore, each of the above mixtures of the present disclosure can be directly used in the etching process because of its extremely high selectivity. Besides, in the above examples, the mixtures with the silicon concentration of 0, 40, 60, 80 and 100 ppm have etch rate of silicon nitride of about 5-6 nm/min at about 150 to 155° C. As such, the silicon concentration has minimal impact on the etch rate of silicon nitride.

In operation S3, the wafer is submerged into the mixture within the process tank to remove silicon nitride. During processing the wafer, the temperature of the mixture should be maintained at a predetermined range to maintain the etch rate of silicon nitride, such as about 150 to 155° C. of the specific examples mentioned above but not limited thereto.

The silicon concentration of the mixture is also needed to maintain at a predetermined range to maintain the selectivity. However, the chemical composition of the mixture will be changed during processing the wafers. Thus, in various embodiments, after operation S3, the method 300 further includes steps below. First, the silicon concentration of the mixture is continuously measured to obtain a measured silicon concentration. The measured silicon concentration is then compared to the predetermined silicon concentration to determine whether the measured silicon concentration is within a predetermined range of the predetermined silicon concentration. Finally, upon determining that the measured silicon concentration is not within the predetermined range of the predetermined silicon concentration, supplying phosphoric acid or the silicon-containing material into the process tank to maintain the silicon concentration to within the predetermined range of the predetermined silicon concentration. For an example, if the measured silicon concentration is higher than an upper limit of the predetermined range, an appropriate amount of phosphoric acid will be supplied into the process tank to dilute the mixture. In contrast, if the measured silicon concentration is lower than a lower limit of the predetermined range, an appropriate amount of the silicon-containing material will be supplied into the process tank to slightly increase the silicon concentration of the mixture. Thus, the silicon concentration can be maintained in the predetermined range so as to maintain the selectivity.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A method of selectively removing silicon nitride, comprising:
   providing a wafer having silicon nitride on a surface of the wafer;
   supplying pure phosphoric acid via a first component supplier;
   supplying tetraethoxysilane (TEOS) to the first component supplier via a second component supplier;
   supplying a mixture of phosphoric acid and tetraethoxysilane from the first and second component supplier into a process tank, wherein the tetraethoxysilane of the mixture has a predetermined silicon concentration less than about 200 ppm based on the weight of the mixture; and
   submerging the wafer into the mixture having a temperature in a range of about 100° C. to about 140° C. within the process tank to remove the silicon nitride;
   measuring a silicon concentration of the mixture after submerging the wafer into the mixture within the process tank; and
   supplying the TEOS into the process tank when the measured silicon concentration of the mixture is lower than a predetermined range of the predetermined silicon concentration.

2. The method of claim 1, further comprising heating the mixture to the temperature before submerging the wafer into the mixture within the process tank.

3. The method of claim 2, wherein the temperature is in a range of about 100° C. to about 120° C.

4. The method of claim 1, wherein the predetermined silicon concentration of the tetraethoxysilane of the mixture is less than about 120 ppm based on the weight of the mixture.

5. The method of claim 1, wherein the predetermined silicon concentration of the tetraethoxysilane of the mixture is greater than or equal to about 40 ppm based on the weight of the mixture.

6. The method of claim 1, wherein the wafer further has silicon oxide.

7. The method of claim 1, wherein the wafer has a silicon nitride layer.

8. The method of claim 1, wherein supplying the mixture of the phosphoric acid and the TEOS into the process tank is conducted by respectively supplying the phosphoric acid and the TEOS into the process tank.

9. The method of claim 1, further comprising:
   adjusting a switching valve to allow the pure phosphoric acid to enter the process tank.

10. The method of claim 9, further comprising preheating the phosphoric acid to a temperature in a range of about 100° C. to about 140° C. before supplying the TEOS to the first component supplier.

11. The method of claim 10, wherein preheating the phosphoric acid is preheating the phosphoric acid to the temperature in a range of about 100° C. to about 120° C.

12. The method of claim 1, further comprising:
   supplying the phosphoric acid into the process tank when the measured silicon concentration of the mixture is higher than the predetermined range of the predetermined silicon concentration.

13. The method of claim 12, wherein the supplying the phosphoric acid comprises:
adjusting a switch valve to allow the phosphoric acid into the process tank.

14. The method of claim 1, wherein the supplying the TEOS comprises:
adjusting a switch valve to allow the TEOS into the process tank.

15. The method of claim 1, further comprising preheating the phosphoric acid before supplying the TEOS to the first component supplier.

16. The method of claim 1, further comprising maintaining the temperature of the mixture after submerging the wafer into the mixture.

17. The method of claim 1, wherein no dummy wafer is soaked in the mixture before submerging the wafer into the mixture.

18. The method of claim 1, wherein the wafer is submerged into the mixture immediately after supplying the mixture into the process tank.

19. The method of claim 1, further comprising mixing the phosphoric acid and the TEOS in the first component supplier.

* * * * *